Dec. 24, 1968 Q. BERG 3,418,089

ASSEMBLY FOR TRANSISTOR MANUFACTURE

Filed Dec. 16, 1965 2 Sheets-Sheet 1

*INVENTOR.*
QUENTIN BERG
*BY*
Whittemore, Hulbert & Belknap
ATTORNEYS

ASSEMBLY FOR TRANSISTOR MANUFACTURE

Filed Dec. 15, 1965 2 Sheets-Sheet 2

*INVENTOR.*
QUENTIN BERG
*BY*
Whittemore, Hulbert & Belknap
ATTORNEYS

United States Patent Office 3,418,089

Patented Dec. 24, 1968

3,418,089

ASSEMBLY FOR TRANSISTOR MANUFACTURE

Quentin Berg, Berg Electronics, Inc.,
New Cumberland, Pa. 17070

Filed Dec. 16, 1965, Ser. No. 524,986
7 Claims. (Cl. 29—193.5)

This invention relates to improvements in the manufacture of circuit elements, and particularly to the use of an improved double carrier strip assembly for holding transistor lead wires during attachment of transistor elements to the lead wires and during encapsulation of the transistor element within a protective plastic nodule.

In the manufacture of transistors it is desirable to hold groups of lead wires in a relatively rigid assembly during the attachment of the transistor elements to the lead wires, and then hold the groups of wires in a flexible assembly during encapsulation of the transistors in plastic so as to prevent damage to the transistors or the encapsulation press due to thermal expansion of the assembly in the press.

In conventional manufacture of transistors, spaced groups of transistor lead wires are held between a pair of sheet metal strips so as to form a ladder-like assembly which holds the lead wires during the steps of manufacture. This type of assembly satisfactorily positions the groups of transistor lead wires during the attachment of the transistor elements thereto. However, when this assembly is positioned within the encapsulation press the heat from the press causes the metal strips to expand and move the groups of transistor lead wires out of proper alignment within the press die. The strip expansion also causes movement between adjacent individual lead wires within a given group, which often results in rupturing the very small gold transistor element leads which are used to connect the transistor element to the transistor lead wires.

The invention avoids these problems by providing a double carrier strip for holding the groups of lead wires. This carrier strip includes a flexible inner strip and a relatively rigid outer strip. The groups of transistor lead wires are attached to the inner strip at spaced intervals along its length. Cut-out stress relief portions are provided in the inner strip between each group of lead wires, and the outer strip is removably secured to the portions of the inner strip holding the groups of lead wires and provides rigid support therefor. The groups of transistor lead wires run between a pair of double carrier strips so as to form a ladder-like assembly.

During the assembly of the transistor element to the transistor lead wires held in the double carrier strip assembly, the outer carrier strips provide the required positional rigidity for locating the groups of lead wires as desired. The assembly is then positioned within the encapsulation press with the groups of lead wires fitted in the lower die thereof, following which the rigid outer strips are broken away from the flexible inner strips. The press is then closed and the transistor elements are encapsulated within a protective plastic nodule. The cutout stress relief portions of the inner strips relieve the thermal stresses created by the high temperature of the encapsulation press so as to prevent the undesired relative movement of the groups of transistor lead wires while the assembly is within the press and also to prevent breaking of the very fine gold transistor element leads which connect the transistor element and the transistor lead wires of each group.

Accordingly, a principal object of the invention is to provide a novel double carrier strip assembly for use in the manufacture of circuit elements.

A further object is to provide a transistor lead wire assembly with a double carrier strip having a rigid outer strip and a flexible inner strip.

Other objects and features of the invention will become apparent as the description proceeds, especially when taken in conjunction with the accompanying drawings, illustrating a preferred embodiment of the invention, wherein.

Figure 2:
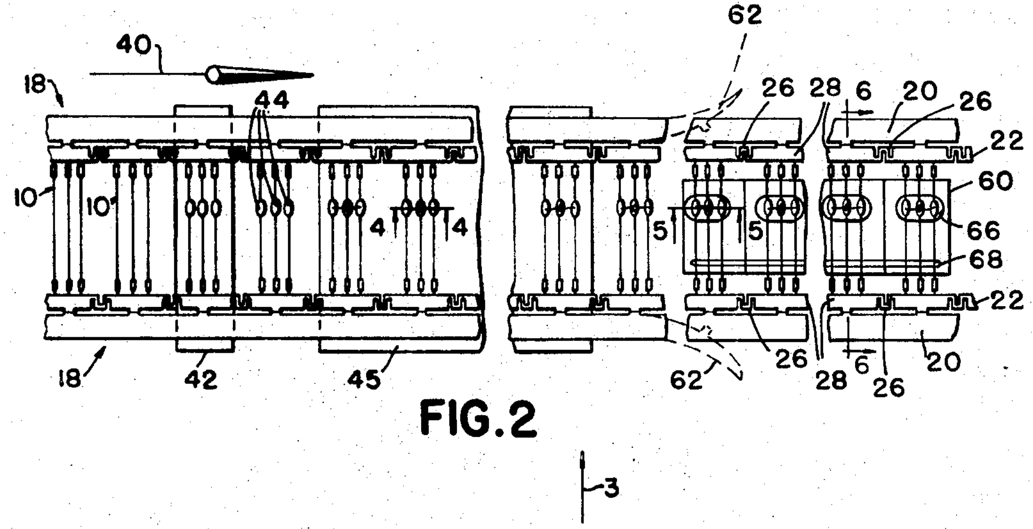
FIGURE 2 is a representational plan view showing the steps of manufacturing a transistor according to the invention.
Figure 4:
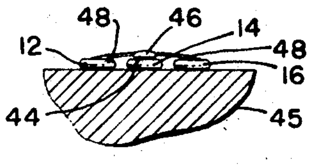
Figure 5:
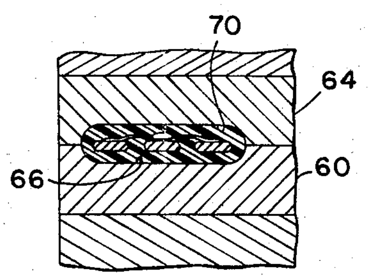
Figure 6:
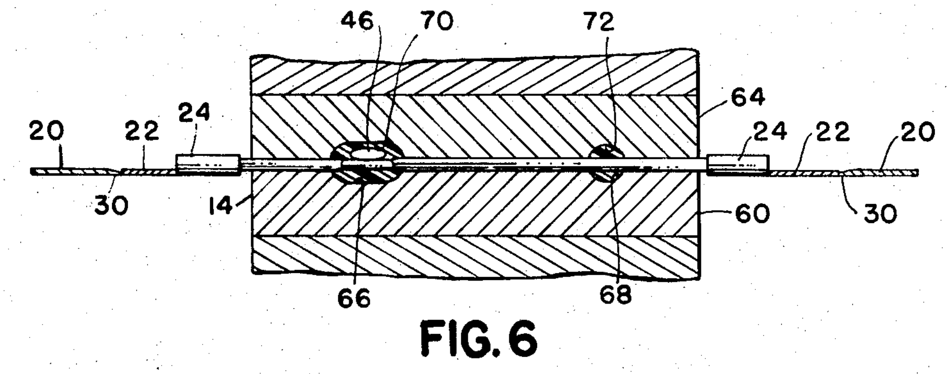
Figure 7:
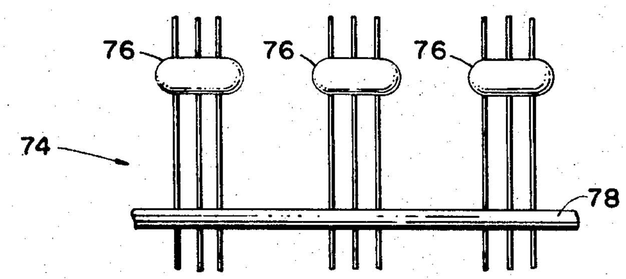

FIGURES 4, 5 and 6 are enlarged sectional views taken along line 4—4, 5—5, and 6—6 respectively of FIGURE 2; and FIGURE 7 illustrates part of a strip of completed transistors manufactured according to the invention.

Figure 1:
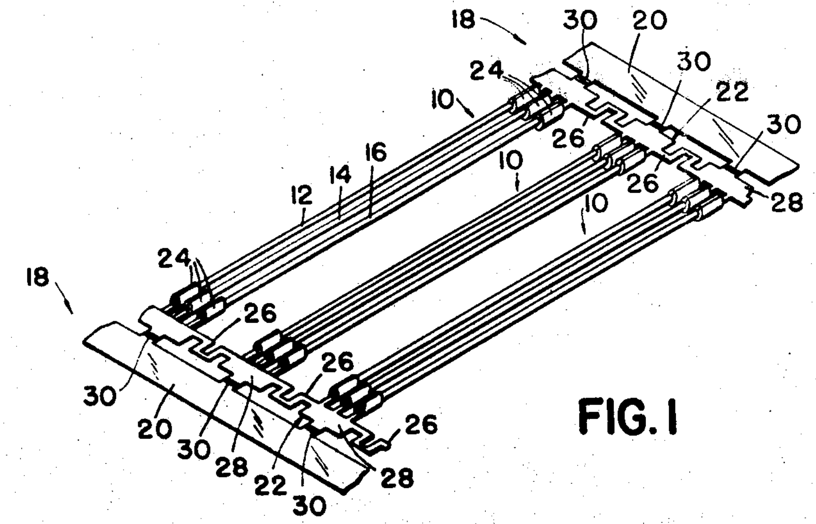
FIGURE 1 is a perspective view of a section of a carrier strip assembly according to the invention.

Referring now to the drawings, FIGURE 1 shows a portion of a transistor lead wire assembly according to the invention wherein groups of transistor lead wires 10 each contain three spaced parallel transistor lead wires 12, 14 and 16. The lead wires are held at their ends by two like double carrier strips 18, each of which is formed from sheet metal stock and includes a relatively rigid outer strip 20 and a flexible inner strip 22. Each inner strip 22 carries groups of three wire barrels 24 spaced along its inner edge. The wire barrels are crimped to the ends of the transistor lead wires 12, 14 and 16 and serve to hold and locate the lead wires within the assembly. The inner strips 22 are also provided with flexible serpentine cut-out portions 26 located at spaced intervals along the length of the strips between the groups 10 of transistor lead wires. The portions 28 of the inner strip 22 located between cut-out portions 26 which hold the wire barrels 24 are relatively rigid compared to the flexible cut-out portions 26 so that the barrels 24 are accurately located on the inner strips 22. Connecting portions 30 secure each portion 28 of the inner strip 22 to the rigid outer strip 20 so as to provide accurate location of the groups 10 within the assembly. The connecting portions 30 are scored so that the outer strips 20 may be easily detached from the assembly by breaking the scored connections.

Figure 3:
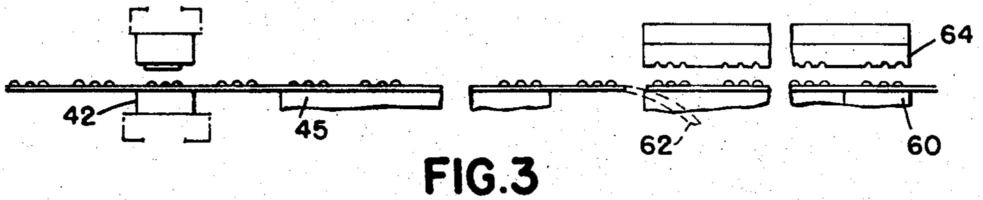
FIGURE 3 is a side elevational view taken in the direction of arrow 3 of FIGURE 2.

FIGURES 2 and 3 illustrate one way in which the transistor lead assembly illustrated in FIGURE 1 may be used in the manufacture of transistors. An indefinite length of the assembly may be wound on a reel (not shown) located to the left of FIGURE 2 so that the assembly is fed from the reel in the direction of the arrow 40 in FIGURE 2. As each group 10 of transistor lead wires is moved past coining press 42, the press is actuated and coins the transistor lead wires 12, 14 and 16 as indicated so as to provide flat transistor contact surfaces 44 thereon. The assembly is moved past the coining press 42 until a number of groups 10 of coined transistor lead wires are accurately positioned on the transistor assembly table 45. At this time transistor elements 46 (see FIGURE 4) are attached to the coined area 44 of transistor lead wire 14 of each group 10 on the table, and the very fine gold transistor element leads 48 of the transistor element 46 are welded or suitably attached to the adjacent coined contact areas 44 of the transistor lead wires 12 and 16. Due to the delicacy of the transistor element 46 and of the gold transistor element lead wires 48, the groups 10 of transistor lead wires must be positioned very accurately upon the table 45 so as to assure that the transistor element is properly secured to the transistor lead wires. The outer strip 20 of each carrier strip 18, being rigid and integrally connected to each portion 28 of the inner strip 22, accurately positions each of the portions 28 of the inner strip 22 so that the groups 10 are held in a fixed relation during this step.

After the transistor elements have been attached to each of the groups 10 of transistor lead wires positioned on the transistor assembly table 45, the assembly is moved further to the right so as to position each of said groups 10 on the lower die 60 of the encapsulation press. The individual wires 12, 14 and 16 of each group 10 are fitted in grooves in the lower die so as to assist in assuring proper location of the groups within the press. When the groups 10 are properly positioned in the press, the coined contact areas 44 of each group of transistor lead wires are positioned over a recess 66 within the lower die of the press, and all of the transistor lead wires of the groups 10 in the press run across axial groove 68 in the lower press die. Following location of the groups 10 within the lower die, the outer strips 20 adjacent the groups 10 within the press are broken away from the assembly as indicated at 62 so that the groups 10 within the press are held in the assembly solely by means of inner strips 22. The upper die 64 of the encapsulation press is complementary with the lower die 60 and includes recesses 70 complementary with recesses 66 of the lower die, and also an axial groove 72 complementary with groove 68 of the lower die.

After stripping away of the outer strips 20 from the groups 10 positioned on the lower die 60, the press is closed so that the upper die is brought into abutment with the lower die, as shown in FIGURES 5 and 6, and hot plastic is injected into the cavities formed by recesses 66 and 70 and grooves 68 and 72. Upon setting of the injected plastic, the press is opened and the lead wires 12, 14 and 16 of each group 10 are severed adjacent the wire barrels 24 of the inner carrier strips 22 so that the end product of the manufacture is a strip 74 of transistors in which the transistor elements are encapsulated in a protective plastic nodule 76 and in which each group of transistor lead wires is held together in a strip means of a plastic bus bar 78 formed by grooves 68 and 72.

In repeated operation of the encapsulating press the upper and lower dies 60 and 64 become quite hot due to the high temperature of the molten plastic. This high temperature causes the transistor lead wire assembly to expand after it has been positioned on the lower die 60. Following removal of the outer strip 20, the flexible serpentine portions 26 of the inner strips 22 absorb the thermal expansion of the transistor lead assembly due to contact with the lower press die. After the press has closed and the upper die has seated around the lead wires of the transistor lead assembly, these flexible portions of the inner strip continue to serve to allow for slight adjustment between adjacent groups 10 due to the thermal stresses caused by the injection of the very hot molten plastic. It is important to isolate the groups of transistor lead assemblies from the stresses caused by the encapulation step of manufacture since the transistor element 46 and the very small gold transistor leads 48 are very delicate and any relative movement of the transistor lead wires 12, 14 and 16 within a given group 10 is very likely to damage the transistor element 46 or rupture one of the leads 48. Additionally, it has been found that if solid carrier strips are used to position the groups 10 during the encapsulation process, the thermal expansion experienced due to the heat of the encapsulation press causes the transistor lead wires to move out of the grooves in the die faces and allows for leakage of molten plastic, which results in corrosion of the die face and an imperfectly encapsulated group of transistors.

While the invention has been described with particular reference to the manufacture of transistors, it is clear that the double strip carrier leads and method disclosed herein have utility in the manufacture of any circuit element wherein it is important to maintain adjacent groups of lead wires in fixed relation during one operation and then allow for relative movement of said groups during another operation. Thus the invention is not limited to the manufacture of transistors per se but may have application to the manufacture of diodes, capacitors, resistors, or other circuit elements. It is not necessary that one step in the manufacture be that of encapsulating a circuit element in plastic since there are other operations which require accurate positioning of individual lead wires while each group of lead wires may be moved relative to each adjacent group. Accordingly, the invention has wide utility and is not limited to the specific application set forth in the specification.

What I claim as my invention is:

1. An assembly for use in the manufacture of circuit elements comprising two spaced parallel carrier strips and groups of parallel wires running between said carrier strips, each carrier strip comprising a strip including wire holding sections and stress relief portions located alternately along the length of said strip so that each of said sections is isolated from adjacent sections by one of said portions, means for securing the wires in each of said group to one of said wire holding sections of each strip, and removable means for holding each of said sections rigidly in fixed relation to each other whereby removal of said removable means frees said group of wires for movement relative to each other in response to flexing of said portions.

2. An assembly as in claim 1 wherein said removable means is a relatively rigid metal strip and each of said carrier strips is formed from a single strip of sheet metal stock.

3. An assembly as in claim 1 wherein said stress relief portions are serpentine shaped cut-out portions of said strip.

4. A carrier strip for use in the manufacture of circuit elements comprising a flexible strip and a relatively rigid strip, said flexible strip including wire holding sections and flexible stress relief portions located alternately along the length thereof, and a severable rigid connection between each of said sections and said rigid strip whereby said rigid strip holds each of said sections in fixed relation in said carrier strip and is readily removable therefrom by severing said connections so as to free said sections for movement relative to each other in response to flexing of said portions.

5. A carrier strip as in claim 4 wherein said rigid and flexible strips are co-planar.

6. A carrier strip as in claim 4 wherein said rigid and flexible strips are formed from a single strip of sheet metal stock.

7. A carrier strip as in claim 4 wherein each of said sections is provided with wire holding means.

References Cited

UNITED STATES PATENTS

| | | | |
|---|---|---|---|
| 3,278,018 | 10/1966 | Ishler et al. | 206—56 |
| 3,281,628 | 10/1966 | Bauer et al. | 317—234 |

L. DEWAYNE RUTLEDGE, *Primary Examiner.*

E. L. WEISE, *Assistant Examiner.*

U.S. Cl. X.R.

29—588, 627; 317—234; 113—119